US008878050B2

(12) United States Patent
Gilman

(10) Patent No.: US 8,878,050 B2
(45) Date of Patent: Nov. 4, 2014

(54) COMPOSITE PHOTOVOLTAIC DEVICE WITH PARABOLIC COLLECTOR AND DIFFERENT SOLAR CELLS

(71) Applicant: Boris Gilman, Mountain View, CA (US)

(72) Inventor: Boris Gilman, Mountain View, CA (US)

( * ) Notice: Subject to any disclaimer, the term of this patent is extended or adjusted under 35 U.S.C. 154(b) by 0 days.

(21) Appl. No.: 13/681,988

(22) Filed: Nov. 20, 2012

(65) Prior Publication Data

US 2014/0137923 A1 May 22, 2014

(51) Int. Cl.
*H01L 31/052* (2014.01)

(52) U.S. Cl.
CPC .............. *H01L 31/0525* (2013.01); *Y02E 10/50* (2013.01)
USPC ........................................................ 136/246

(58) Field of Classification Search
CPC .... H01L 31/042; H01L 31/052; H01L 25/045
USPC ........................................................ 136/246
See application file for complete search history.

(56) References Cited

U.S. PATENT DOCUMENTS

| | | | |
|---|---|---|---|
| 7,851,693 B2 | 12/2010 | Fork et al. | |
| 7,871,664 B2 | 1/2011 | O'Connor et al. | |
| 8,058,546 B1 | 11/2011 | Casperson | |
| 2005/0056312 A1* | 3/2005 | Young et al. | 136/258 |
| 2006/0231133 A1 | 10/2006 | Fork et al. | |
| 2008/0210292 A1 | 9/2008 | Urli | |
| 2009/0229652 A1* | 9/2009 | Mapel et al. | 136/246 |
| 2010/0051102 A1* | 3/2010 | Lin | 136/259 |
| 2012/0014006 A1* | 1/2012 | Herniak | 359/853 |

FOREIGN PATENT DOCUMENTS

| | | |
|---|---|---|
| CN | 102237417 | 11/2011 |
| TW | 200933913 | 8/2011 |
| WO | WO2007130795 | 11/2007 |
| WO | WO2010129594 | 11/2010 |

OTHER PUBLICATIONS

F.Newman, D.Aiken et al. "Current status of III-V concentrating multijunction manufacturing technologiy . . . ", Proc. of 23rd European PV Solar Energy Conf.,Valencia,Spain, 2008.

* cited by examiner

*Primary Examiner* — Jeffrey T Barton
*Assistant Examiner* — Tae-Sik Kang

(57) ABSTRACT

Proposed is a composite photovoltaic device with parabolic collector and different solar cells, wherein the high photoelectric conversion efficiency is achieved along with significant material cost reduction. The device comprises two or three solar cells formed on opposite sides of a transparent substrate, and a parabolic collector attached to the back side of the substrate. First thin film solar cell formed on the front side receives and converts to electricity a short-wavelength portion of the incoming Sun radiation, and transmits the long-wavelength portion. A second solar cell receives and converts to electricity a concentrated long-wavelength portion of the Sun radiation, which is re-directed toward a focal point by the parabolic collector. In one embodiment a third solar cell is included for converting an IR portion of the radiation. Thus, each solar cell utilizes a favorable part of the Sun spectrum, which allows for an enhancement of photoelectric efficiency and significant material cost reduction.

4 Claims, 4 Drawing Sheets

US 8,878,050 B2

COMPOSITE PHOTOVOLTAIC DEVICE WITH PARABOLIC COLLECTOR AND DIFFERENT SOLAR CELLS

FIELD OF THE INVENTION

The invention relates to a composite photovoltaic (PV) device that comprises a common transparent substrate, two solar cells of different materials and different sizes, and concentrating parabolic collector for providing concentrated radiation for at least one solar cell. More specifically, the invention relates to a spectrum-splitting photovoltaic device, wherein different solar cells absorb and convert to electricity different spectral portions of the Sun radiation, including concentrated portions, thus providing a significantly better utilization of the Sun radiation, higher photoelectric conversion efficiency and significant reduction of photo-active materials.

BACKGROUND

At the present time one of the main problems of a global solar energy implementation is difficulty in reaching high photoelectric energy conversion efficiency (ECE) at low cost of materials and processes involved in building solar cells and panels. Typically, usage of low cost materials, such as thin films, results in lower ECE, while achieving higher ECE requires expensive materials, e.g., mono-crystalline Silicon (Si), compound materials, such as InGaAs, GaAlAs, and the likes. Some of well known techniques for overcoming high cost of III-V compound materials include using concentrated Sun radiation, which is directed toward smaller solar cells to generate electrical power. Such photovoltaic devices (hereinafter referred to as CPV devices) allow for significantly lower consumption of expensive photovoltaic materials, while providing the same or higher amount of electricity. At the same time CPV devices require additional optical elements (lenses, mirrors) and efficient cooling tools for maintaining optimal PV operation.

In order to increase ECE of CPV devices it is common to use PV structure of stacked solar cells (SC), wherein a material band gap decreases from cell to cell in the direction away from the light-receiving surface, thus providing a multijunction solar cell (MJSC). The combination of MJSC and concentrated radiation is described in many references, see e.g. "Current status of III-V concentrating multijunction manufacturing technology and device technology development" by F. Newman, D. Aiken et al., *Proceedings of 23$^{rd}$ European Photovoltaic Solar Energy Conference*, Valencia, Spain, (2008). Most commonly used III-V material-based MJSC may also include low band gap layers of a single semiconductor, such as Ge, as described, e.g., in the Patent Application TW200933913, published on Aug. 1, 2011, authors Aiken Daniel J et al.

The multijunction approach, described above, is also widely used in a variety of Si and Thin Film (TF)-based PV devices, in which case respective PV devices are commonly called Tandem Solar Cells (TSC). A TSC device typically comprises top SC and bottom SC, each having it's own band gap, thus providing a sunlight spectrum split between the cells. Some examples of TSC can be found, e.g., in "Tandem photovoltaic device and method of manufacturing the same", Patent Application CN102237417, published on Nov. 9, 2011, author Seung-Yeop Myong, and in many other references. A TSC may operate at regular (non-concentrated) or CPV conditions.

It should be noted that, regardless of operating TSC in a regular or CPV mode, the areas of top SC and bottom SC in a TSC structure are essentially the same (defined by a "stack" dimensions), and a series electrical connection should be provided between top SC and bottom SC. It is, therefore, understood that, in order to form top and bottom cells, all known TSC use respective materials for top cell and bottom cell in the amounts necessary to cover the entire area of a TSC.

CPV devices of all kinds include means for concentrating incoming sunlight, these means are hereinafter referred to as solar collectors. Solar collectors may comprise set of lens, concave spherical mirrors and parabolic mirrors (the latter is hereinafter referred to as concentrating parabolic collector or simply parabolic collector). Relevant to the present invention is the observation that, to the best of our knowledge, all known PV devices and CPV devices utilize either regular (non-concentrated) Sun radiation or concentrated Sun radiation for an entire device, i.e., without splitting sunlight spectrum into the regular and concentrated portions.

SUMMARY OF THE INVENTION

The present invention provides a high-efficient composite photovoltaic device (hereinafter referred to as "PV device") comprising a transparent substrate having a front side and a back side, a concentrating parabolic collector attached to the back side of the substrate, and further comprising two or more solar cells made of different materials and having different sizes, formed on the opposite sides of the transparent substrate. The invention allows for a substantial increase of the photoelectric energy conversion efficiency (ECE) and significant reduction of the materials needed to build the PV device. The above advantages result from the following: 1) using first solar cell of the PV device to generate an electrical power by photoelectric conversion of a first (short-wavelength) portion of the Sun radiation, 2) using parabolic collector for concentrating and directing toward second solar cell a second (longer wavelength) portion of the Sun radiation; 3) using second solar cell to generate additional electrical power by photoelectric conversion of the second portion of the Sun radiation. Electrical power produced by the PV device is the total of the powers produced by the first solar cell and by the second solar cell, which results in significant improvement of ECE. Another advantage of the PV device is significant reduction of the materials needed to build high-efficient second solar cell.

DETAILED DESCRIPTION OF THE INVENTION

In general, the PV device of the present invention employs the following features: 1) splitting the incoming Sun radiation into two spectral portions; 2) concentrating the longer wavelength portion (or portions), and 3) using two solar cells for photoelectric conversion of the above spectral portions. These features are illustrated by FIG. 1, which is a schematic cross-sectional view of main embodiment of the PV device 100.

Figure 1:
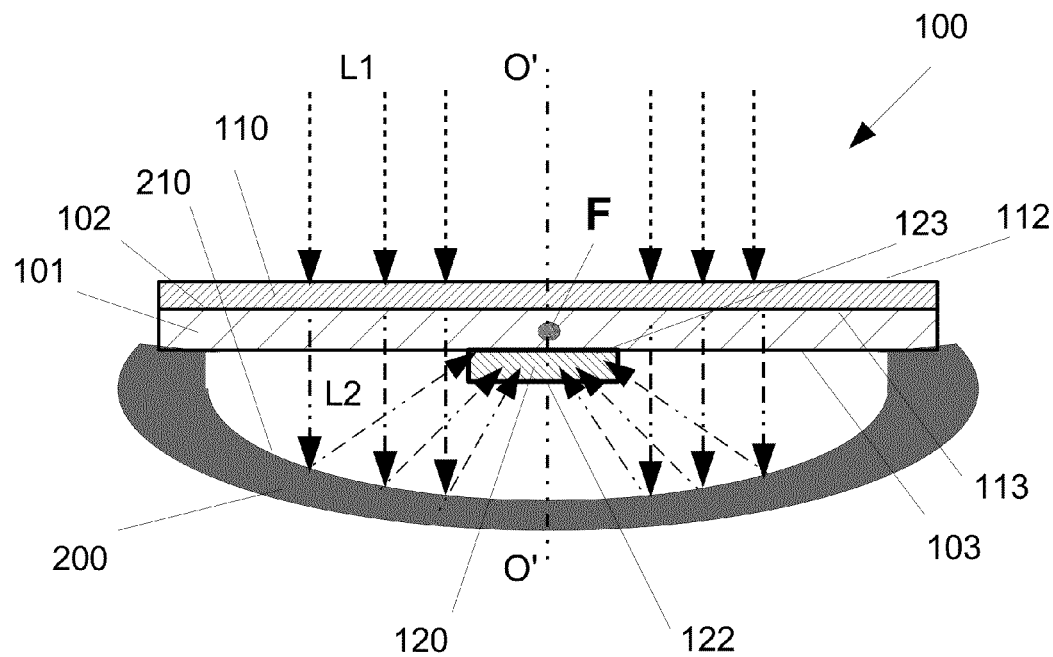
FIG. 1 is a schematic cross-sectional view of the PV device of the present invention, comprising a parabolic collector and two solar cells of different materials and sizes formed on the opposite sides of the transparent substrate.

In FIG. 1 reference numeral 101 designates a transparent substrate (hereinafter referred to as merely a "substrate"), which is made of material transparent to the Sun radiation (typically of AM1 type), such as, e.g., glass plate, quartz plate or transparent plastic. The substrate 101 has a front side 102 and a back side 103. The front side 102 may be textured and pre-coated (not shown) for an anti-reflection purpose as commonly used in known PV devices. Furthermore, the PV device comprises a first solar cell formed on the front side of the transparent substrate and a second solar cell formed on the back side of the substrate. A first solar cell 110 is formed on the front side 102, covering most of the front side. The first solar cell is made of a first material and has a first light-receiving surface 112, which is exposed to the Sun radiation, as shown by the dashed arrows L1, and a first back surface 113. The second solar cell 120 is made of a second material and has a second light-receiving surface 122, an area of the first light-receiving surface 112 of the first solar cell is larger than an area of the second solar cell 122.

Figure 5:
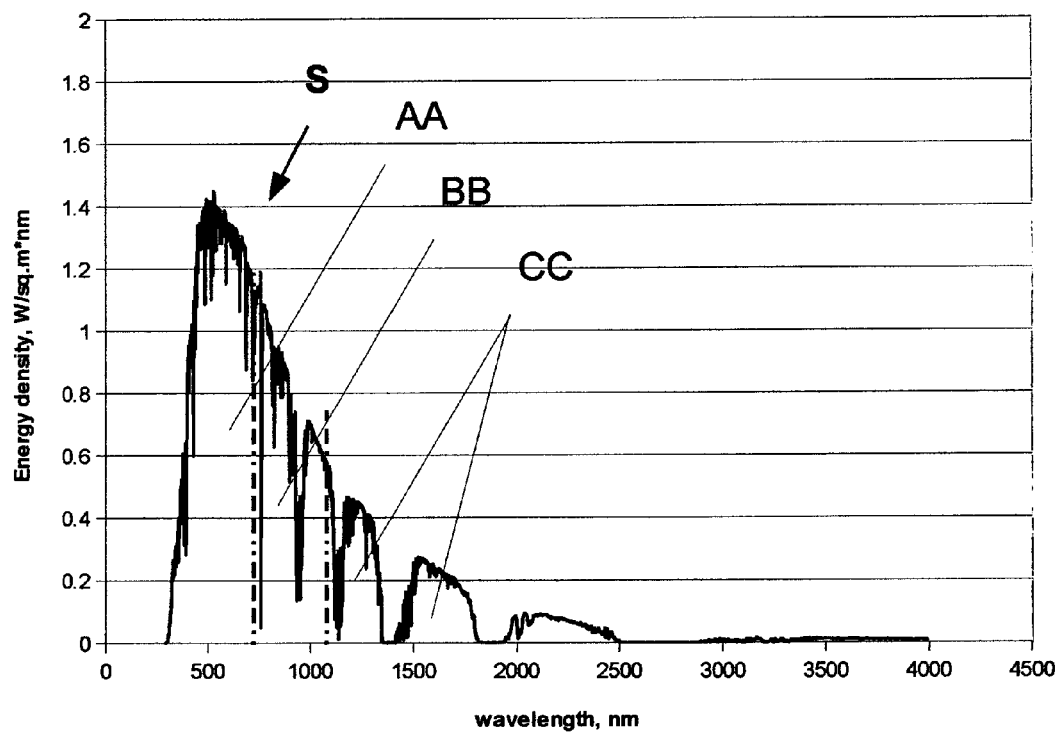
FIG. 5 is a graph that schematically shows the AM1 Solar spectrum along with spectral split and energy distribution between the solar cells of the PV device.

The first solar cell 110 has a first thickness, providing photo-active absorption and photoelectric conversion of a first portion of the Sun radiation. The rest of the Sun radiation (hereinafter referred to as a "second portion") remains unabsorbed in the first solar cell and is transmitted through the substrate, as shown by the dashed arrows marked L2. The first material of the first solar cell is selected from the group of thin film materials that have a band gap in the range of, e.g., 1.5 eV to 2.0 eV and a thickness in the range of, e.g., 200 to 1000 nm. One example of such materials is hydrogenated amorphous silicon (aSi:H). It is understood, that the first portion of the Sun radiation comprises a short-wavelength part of the Sun spectrum, such as the one, shown in FIG. 5 by reference AA (FIG. 5 schematically illustrates the AM1 spectrum "S" and spectral splits between different solar cells of the PV device). The second portion of the Sun radiation comprises a longer wavelength part of the Sun spectrum, as shown in FIG. 5 by reference BB and CC A spectral boundary between the first portion and the second portion (i.e., the longest wavelength that can be absorbed in the first solar cell) is defined by a first band gap of the first material.

The PV device further comprises a concentrating parabolic collector 200 (hereinafter referred to as a "parabolic collector") attached to the back side 103 of the substrate 101. The parabolic collector 200 has a reflective surface 210 that faces the back side of the substrate. The reflective surface 210 is essentially a parabolic mirror commonly used in optical and optoelectronic devices. A focal point of the reflective surface is marked F in FIG. 1. As shown in FIG. 1, the reflective surface 210 receives the second portion of the Sun radiation and re-directs the second non-concentrated portion L2 toward the focal point F, thus ensuring concentrating of the second portion L2 in the vicinity of the focal point. It is understood that the second portion L2 becomes concentrated in the vicinity of the focal point F; it is further referred to as "concentrated second portion" and designated by reference L2m of FIG. 2.

Furthermore, a second solar cell 120 is formed on the back side 103 of the substrate between the focal point F and the reflective surface 210. The second solar cell 120 is made of a second material and has a second light-receiving surface 122 that faces the reflective surface 210, and a second back surface 123 that faces the back side 103 of the substrate 101. The second solar cell 120 has a second thickness, providing photo-active absorption and photoelectric conversion of the concentrated second portion L2m of the Sun radiation. The second back surface 123 and the back side 103 may carry pre-deposited conductive electrodes and connection links, described below.

The second solar cell 120 is positioned in the vicinity of the focal point F in such a way, that the projection of the focal point F onto the second back surface 123 in a direction perpendicular to the back side 103 is within the second back surface 123. This is illustrated by the reference axis O'-O' of FIG. 1. For example, the focal point can be positioned inside the substrate 101, and between the second back surface 123 and the front side 102, as shown in FIG. 1. It is understood that, in order to receive the most of the concentrated second portion L2m, generated by the reflective surface 210, the second solar cell should provide the second back surface 123 (and, preferably, the central area of it) to be aligned with the focal point F along the axis O-O'. It is further understood that the second light-receiving surface 122 can be pre-textured and pre-coated (not shown) for anti-reflection purposes as commonly used in known PV devices.

As shown in FIG. 1, the second light-receiving surface 122 receives a concentrated second portion L2 of the Sun radiation, therefore, the first light-receiving surface of the first solar cell may be substantially larger than the second light-receiving surface of the second solar cell. More specifically, an area ratio of the first light-receiving surface to the second light-receiving surface may be in the range of 10 to 200, depending on the proximity of the second light-receiving surface to the focal point F. This important feature of the PV device ensures a significant reduction of the amount of the second material needed to form the second solar cell, i.e., a substantial cost reduction of the device.

According to the present invention, a band gap of the first material of the first solar cell 110 is wider than a band gap of the second material of the second solar cell 120. The second material of the second solar cell is selected from the group of mono crystalline or polycrystalline materials that have a band gap in the range of, e.g., 0.7 eV to 1.5 eV, and having a thickness in the range of, e.g., 50 μm to 250 μm. One example of the second material is monocrystalline Silicon (c-Si). As a result, the second solar cell provides an efficient light absorption and photo-electric conversion of the second portion of the Sun radiation, which comprises a longer wavelength part of the Sun spectrum, such as the one shown in FIG. 5 by reference BB.

Figure 2:
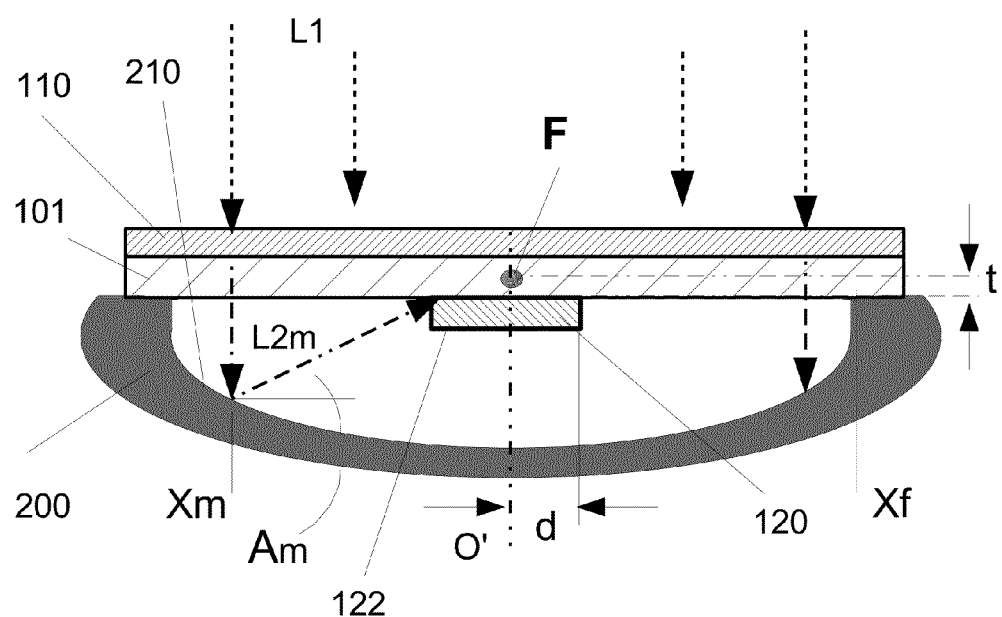
FIG. 2 is a partial view of the PV device of the present invention, that shows boundaries and the area of an efficient light absorption in the second solar cell.

The laws of geometric optics impose certain limitations on the amount of the second portion L2 of the sun radiation that can be used (in concentrated form) in the second solar cell. These limitations are shown in FIG. 2, which is a partial view of the PV device of the present invention, that shows boundaries of an efficient light absorption in the second solar cell. For simplicity the PV device is symmetrical with the position of the origin O' aligned to the center of the reflective surface 210 and to the center of the second solar cell 120. Reference Xf (shown for the right side only) designates the boundaries of the reflective surface, which is approximately equal to the width of the first solar cell). Reference Am designates the maximum angle of reflection for the light rays of the second portion L2, that will be received by the second light-receiving surface 122. Consequently, the light ray marked L2m and the reference Xm designate boundaries of the concentrated part L2m of the portion L2 that will be received and converted to electricity by the second solar cell. It is understood, that, although references Am and Xm are shown only for the left side of the cross-sectional view, similar boundaries exist on the right side. It is further understood, that light rays of the second portion L2 of the Sun radiation, which hit the reflective surface 210 at the angles smaller than Am, will not be received by the second solar cell.

Boundary position Xm depends on the geometrical parameters of the PV device such as parabolic factor A (which is defined by a parabolic equation of the reflective surface $Y=AX^2$), width of the second solar cell 120 (half of which is shown in FIG. 2 by reference d), and the distance between the focal point F and the back surface 123 of the second solar cell 120 designated by reference t. Calculations based on the laws of the geometric optics result in the following equation:

$$Xm=1/2A[SQRT(Z^2+1)-Z] \quad (1)$$

$$\tan(Am)=Z \quad (2)$$

where A is parabolic factor of the reflective surface, Z=t/d. Apparently, for Z<<1, which corresponds to the close proximity of the back surface of the second solar cell to the focal point (as compared to the second solar cell size) the equation (1) results in Xm being approximately equal to Xf. It is understood that in that case the most of the light portion L2 is utilized by the second solar cell, and the energy losses are negligible.

For any given parameters of the PV device a ratio S of the second light portion L2 to the concentrated part L2m can be calculated as follows:

$$S=(Xm)^2/(Xf)^2=SQRT(Z^2+1)-Z \quad (3)$$

Example 1 d=0.5 cm, t=0.1 cm. S=0.65 (65% of the second light portion L2 is utilized by the second solar cell).

Example 2 d=0.5 cm, t=0.02 cm, S=0.9 (90% of the portion L2 utilized).

According to the present invention, the following parameters of the PV device can be used: width of the first solar cell—10 cm, Xf=9 cm, half width of the second solar cell d=1 cm, focal point position F (relative to the origin O')=4.5 cm, t=0.02 cm. It should be noted that in this case an area ratio of the first light-receiving surface of the first solar cell to the second light-receiving surface of the second solar cell is approximately 100, which results in proportionate reduction of the amount of the second material needed to form second solar cell. Similar analysis applies to the third material of the third solar cell, which will be described below.

Figure 3A:
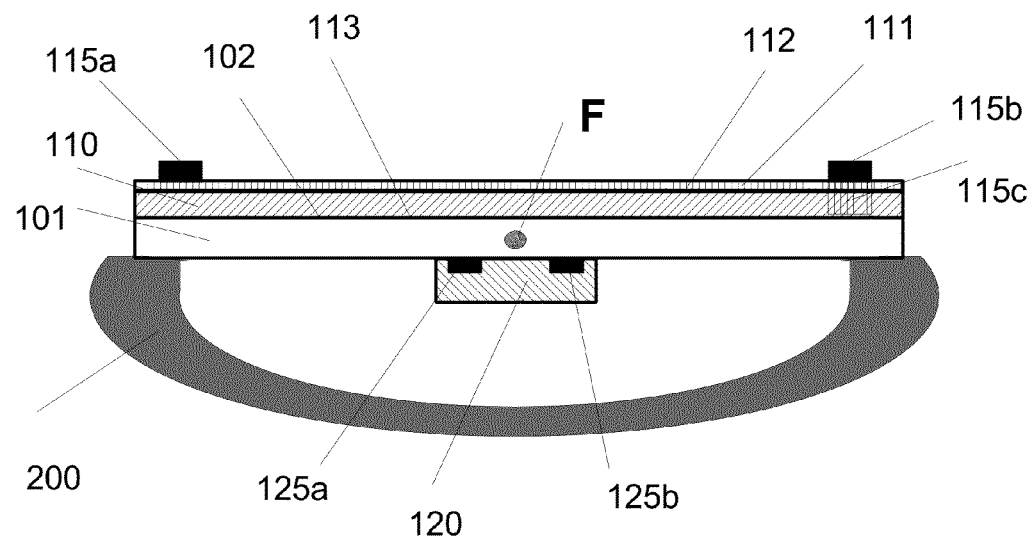
FIG. 3A schematically shows conductive electrodes formed on the first solar cell and the second solar cell of the PV device.

FIG. 3A schematically shows conductive electrodes to the first solar cell 110 formed on the light-receiving surface 112 and on the first back surface 113 of the first solar cell. It also shows conductive electrodes to the second solar cell 120 formed on the second back surface 123 of the second solar cell. In FIG. 3A references numeral 111, 115a and 115b designate conductive electrodes to the thin film first solar cell formed on the first light-receiving surface 112. A transparent conductive electrode 111 (made, e.g. of ITO) may be formed on the surface 112 prior to forming metal electrodes 115a and 115b. The transparent electrode 111 is electrically connected to the conductive electrode of one polarity, e.g., to the electrode 115a. In order to provide the electrode 115b of the opposite polarity (which must be isolated of the electrode 115a), a small area of the first solar cell may be etched off and isolated prior to forming the conductive electrodes 115b, which is shown in FIG. 3a as the hatched region 115c. Also, the electrode 115b can be partially formed on the first back surface of the first solar cell.

References numeral 125a and 125b of FIG. 3A designate conductive electrodes to the second solar cell 120 formed on the second back surface 123. It is understood that in the main embodiment of the PV device the second solar cell 120 is formed, e.g., as a Si-based backside solar cell with the electrodes of both polarities formed on the second back surface 123. Such design allows for the second light-receiving surface to be fully exposed to the concentrated light portion L2m (described above), which results in higher ECE of the PV device.

Figure 3B:
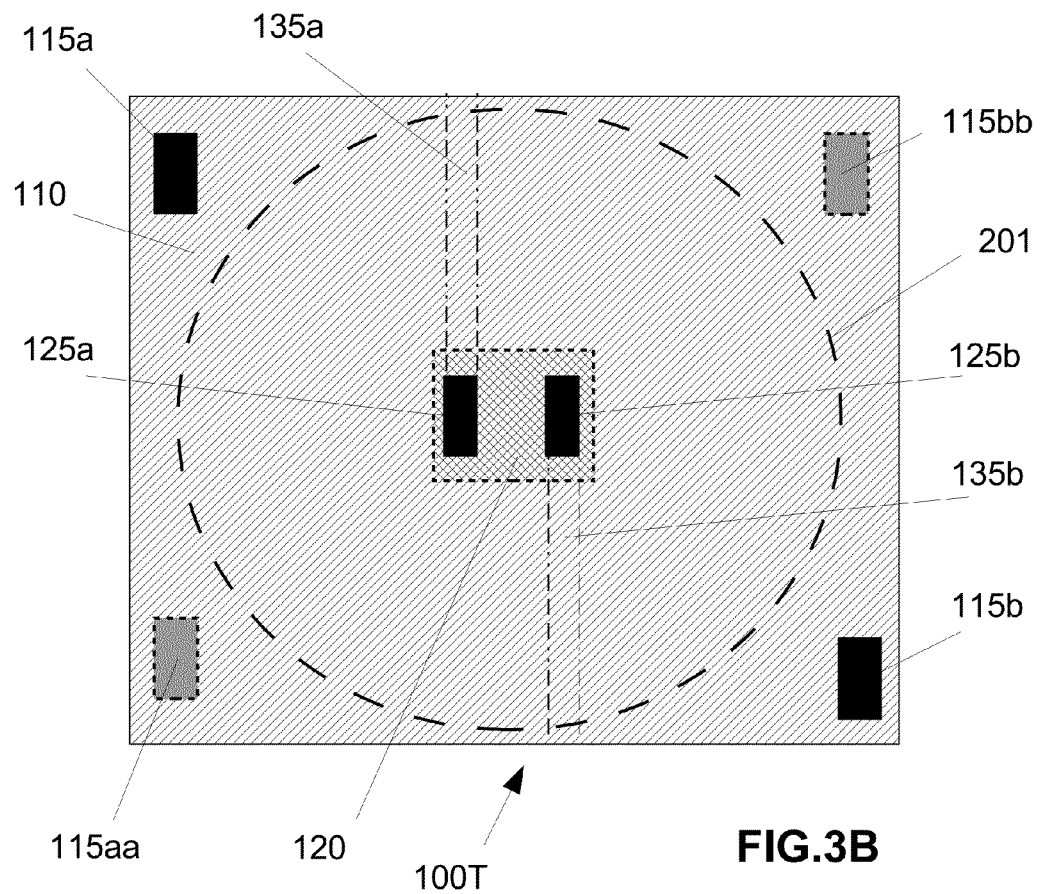
FIG. 3B is a top view of the PV device of FIG. 3A with the conductive electrodes and connection links formed on the back side of the transparent substrate.

FIG. 3B shows the top view of the front side of the PV device of FIG. 3A with the conductive electrodes of FIG. 3A and connection links formed on the front side of the substrate and on the back side of the substrate. The connection links are in contact with conductive electrodes to the first solar cell and to the second solar cell and provide separate output connections for the first solar cell and for the second solar cell. In the drawing the first solar cell is shown as the hatched square 110, and an inner border of the parabolic collector (i.e., an edge contour of the reflective surface) is shown as a dashed circle 201. According to one aspect of the invention the conductive electrodes to the first solar cell can be formed in the corners of the first solar cell, as shown by references numeral 115a and 115aa for one polarity and by references numeral 115b and 115bb for the opposite polarity of the electrodes. In order to provide output connections for the second solar cell, the conductive electrodes to the second solar cell 125a and 125b are complemented by connection links 135a and 135b formed on the back side of the substrate (ref. 103 of FIG. 1) and connected to the electrodes 125a and 125b respectively.

It is understood that shapes, dimensions, and locations of the conductive electrodes and the connection links are shown in FIG. 3A and FIG. 3B only schematically, and any reasonable modifications are allowed provided that these modifications do not depart from the scope of the present invention. It is further understood that, in order to increase the first light-receiving surface exposed to the Sun radiation L1 (for the first solar cell) and the second light-receiving surface exposed to the concentrated second portion of the Sun radiation L2m (for the second solar cell), linear dimensions of the conductive electrodes and links should be made as small as possible (at least for their opaque parts). Materials of the conductive electrodes and connection links can be selected from the group of metals, such as, e.g., Al, AlSi, Ni, Ag, Ti, Cu and their alloys, as well known in art.

Figure 4:
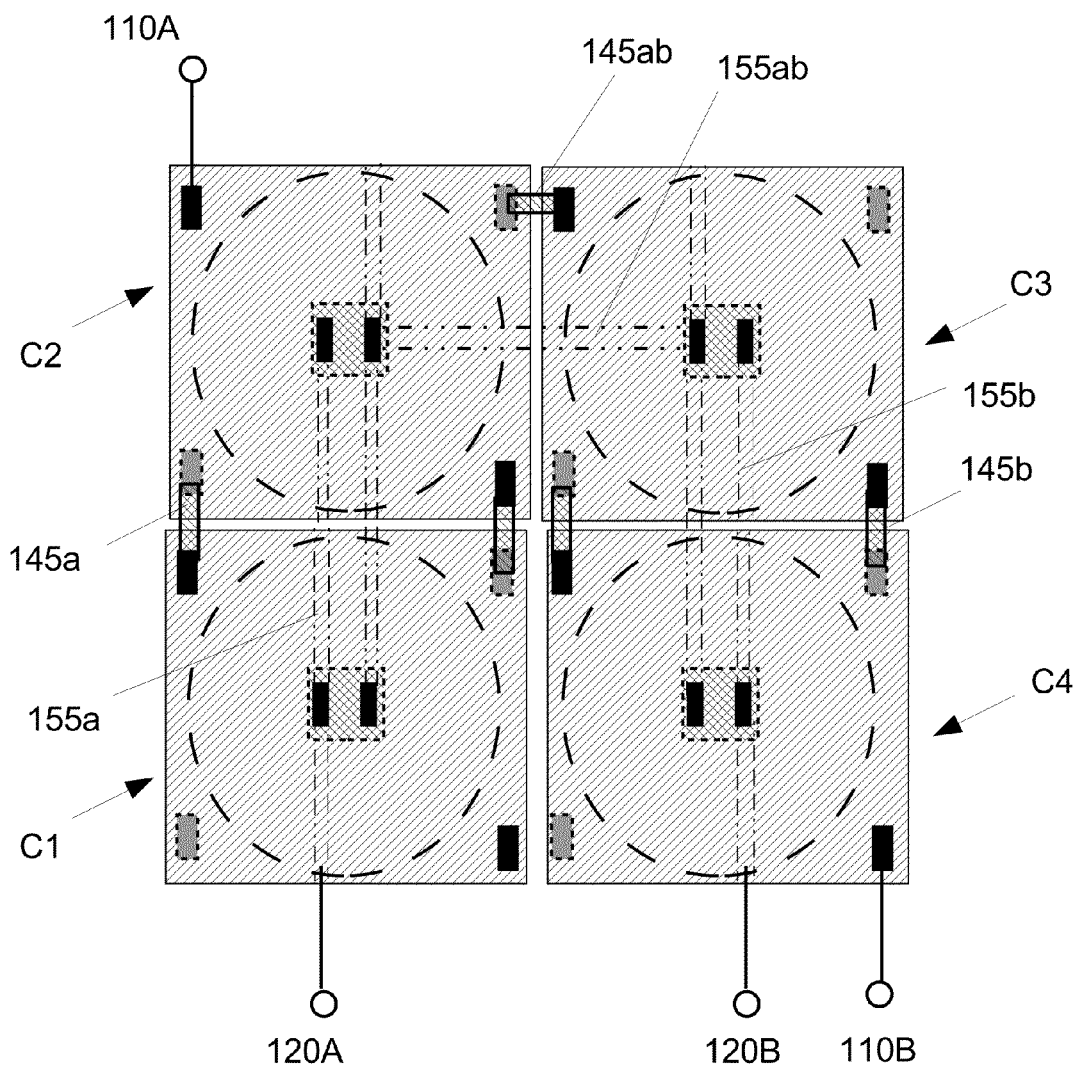
FIG. 4 is a top view of a PV module comprising four PV devices connected in series and in parallel.

For assembling PV devices of the present invention into PV module additional connection links formed on the front side of the substrate and on the back side of the substrate, providing separate output connections for the first solar cell and for the second solar cell as schematically shown in FIG. 4, which is a top view of a PV module segment that comprises four PV devices connected in series and in parallel. The additional connection links 145a, 145b, 155a,155b, 145ab, and 155ab are in contact with conductive electrodes to the first solar cell and to the second solar cell of FIG. 3a and FIG. 3b and provide separate output connections for the first solar cell and for the second solar cell.

The PV module of FIG. 4 comprises four individual PV devices C1, C2, C3, and C4, in which first solar cells and second solar cells of individual devices separately connected in parallel and in series by the connection links. More specifically, connection links 145a (for simplicity shown only on the left side of the devices C1 and C2) provide parallel connection between first solar cells of the devices C1 and C2; connection links 145b (shown only on the right side of the devices C3 and C4) provide parallel connection between first solar cells of the devices C3 and C4. Furthermore, the conductive link 145ab provides series connection of the first solar cell of the device C2 to the first solar cell of the device C3. References numeral 110A and 110B designate output terminals for a group of the first solar cells of the PV module.

Similarly, second solar cells of the devices C1 and C2 are connected in parallel by the connection links 155a, and second solar cells of the devices C3 and C4 are connected in parallel by the connection links 155b; conductive link 155ab provides series connection between the second solar cells of the devices C2 and C3. References 120A and 120B designate output terminals for a group of the second solar cells of the PV module. It is understood that for achieving a highest possible ECE of PV modules, which are assembled of PV devices of the present invention, a group of first solar cells and a group of second solar cells must be connected separately to respective output terminals. It is further understood that illustrated PV module is only an example, and a variety of connection patterns can be designed to incorporate PV devices of the present invention into PV modules.

The PV device of the present invention operates as follows (FIG. 1 to FIG. 4). Incoming regular (non-concentrated) Sun radiation L1 (e.g., of AM1 spectrum) is received by the first light-receiving surface 112 of the first solar cell 110. Short-wavelength first portion of the L1 (shown as AA in FIG. 5) is absorbed and converted to electricity in the first solar cell 110, providing an output electrical power P1 through the conductive electrodes 115a, 115b,115aa, 115bb (FIG. 3a and FIG. 3b). The second longer wavelength portion L2 of the Sun radiation remains unabsorbed in the first cell and transmitted through the substrate 101 toward the parabolic collector 200. It is understood that the second portion L2 in this embodiment is a total of the spectral segments BB and CC of FIG. 5.

The parabolic reflective surface 210 re-directs light rays of the second portion L2 toward the focal point F. Consequently, a concentrated second portion L2m (FIG. 2) of the second portion L2 is received by the second light-receiving surface 122 of the second solar cell 120. A proper choice of the PV device's parameters ensures that the portion L2m is close to the entire second portion L2, as described above in reference to FIG. 2.

It is also understood that due to the high concentration ratio (provided by the parabolic collector) an area of the second solar cell is substantially smaller than an area of the first solar cell. It is further understood that due to the longer wavelength spectrum of the portion L2, ECE of the second solar cell (made, e.g., of c-Si) can be significantly higher than ECE of the same cell at "normal" conditions, i.e., regular Sun spectrum. The second solar cell provides an output electrical power P2 through the conductive electrodes 125a,125b and connection links 135a,135b (FIG. 3a and FIG. 3b). Since the conductive electrodes and the connection links are formed separately for the first solar cell and for the second solar cell, an amount of electrical power P produced by the PV device is total of P1 and P2, i.e., P=P1+P2, which allows for achieving enhanced ECE. For the PV device with previously described parameters of the first and second solar cells a total ECE is expected to be in the range of 22-25%.

Although the invention is shown and described with reference to specific examples, it is understood that these examples should not be construed as limiting the areas of application of the invention and that any changes and modifications are possible provided that these changes and modifications do not depart from the scope of the attached patent claims. For example, in the embodiment with two solar cells the focal point can be positioned both inside and outside the transparent substrate. The front side of the substrate can be pre-textured and pre-coated for anti-reflection purposes, as well as the first and second light-receiving surfaces. Locations and patterns of the conductive electrodes and links can be defined in many different ways providing minimal resistive losses in metal lines, and minimum of shading.

The invention claimed is:

1. A composite photovoltaic device comprising:
   a transparent substrate having a front side and a back side;
   a first solar cell formed on the front side of the transparent substrate and a second solar cell formed on the back side of the transparent substrate;
   the first solar cell made of a first material and having the first light-receiving surface, a second solar cell made of a second material and having a second light-receiving surface, an area of said first light-receiving surface of said first solar cell being larger than an area of said second light-receiving surface of said second solar cell
   the first light-receiving surface of the first solar cell being exposed to the Sun radiation, the first solar cell having a first thickness providing photo-active absorption and photoelectric conversion of a first portion of the Sun radiation and transmitting a second portion of the Sun radiation;
   a concentrating parabolic collector attached to the back side of the transparent substrate, the parabolic collector having a reflective surface facing the back side of the transparent substrate and receiving said second portion of the Sun radiation;
   the second light-receiving surface of the second solar cell facing the reflective surface of the parabolic collector and receiving a concentrated second portion of the Sun radiation reflected from the reflectvie surface of the parabolic collector
   the second solar cell having a second thickness providing photo-active absorption and photoelectric conversion of said concentrated second portion of the Sun radiation.

2. The device of claim 1, wherein a band gap of the first material of the first solar cell is wider than a band gap of the second material of the second solar cell.

3. The device of claim 1, wherein a ratio of the area of the first light-receiving surface to the area of the second receiving surface is in the range of 10 to 200.

4. The device of claim 1, further comprising connection links formed on the front side of the substrate and on the back side of the substrate, said connection links providing separate output connections for the first solar cell and for the second solar cell.

* * * * *